US010305707B1

(12) United States Patent
Stein et al.

(10) Patent No.: US 10,305,707 B1
(45) Date of Patent: *May 28, 2019

(54) DIGITAL DOWN CONVERTER WITH BASEBAND EQUALIZATION

(71) Applicant: Guzik Technical Enterprises, Mountain View, CA (US)

(72) Inventors: Anatoli B. Stein, Atherton, CA (US); Semen P. Volfbeyn, Palo Alto, CA (US); Alexander Taratorin, Palo Alto, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/959,823

(22) Filed: Apr. 23, 2018

(51) Int. Cl.
*H04L 25/03* (2006.01)
*H04B 1/06* (2006.01)

(52) U.S. Cl.
CPC .......... *H04L 25/03828* (2013.01); *H04B 1/06* (2013.01)

(58) Field of Classification Search
CPC ..... H04B 1/0007; H04B 1/0014; H04M 1/06; H04M 1/60; H04M 1/12
USPC ........................................................ 375/235
See application file for complete search history.

(56) References Cited

U.S. PATENT DOCUMENTS

| 7,408,495 | B2 | 8/2008 | Stein et al. | |
| 7,853,978 | B2* | 12/2010 | Endres | H04H 20/63 |
| | | | | 725/74 |
| 9,148,162 | B2 | 9/2015 | Stein et al. | |
| 9,628,097 | B2 | 4/2017 | Johannson | |
| 9,634,679 | B1* | 4/2017 | Stein | H03M 1/0626 |
| 9,641,191 | B1* | 5/2017 | Volfbeyn | H03D 7/165 |
| 2013/0169463 | A1* | 7/2013 | Stein | H03M 1/12 |
| | | | | 341/155 |
| 2015/0200679 | A1* | 7/2015 | Stein | H04L 27/01 |
| | | | | 341/155 |

OTHER PUBLICATIONS

Singh, Epp, et al., "Analysis, Blind Identification, and Correction of Frequency Response Mismatch in Two-Channel Time-Interleaved ADCs,"IEEE Transactions on Microwave Theory and Techniques, vol. 63, No. 5, May 2015.
Proakis, et al., "Digital signal processing", 1996, pp. 785-787.

* cited by examiner

*Primary Examiner* — Kevin M Burd
(74) *Attorney, Agent, or Firm* — Burns & Levinson, LLP; Joseph M. Maria

(57) ABSTRACT

A digital down-converter with baseband equalization comprises a composite analog-to-digital converter (ADC) adapted to convert an applied RF analog signal to be processed to a digital signal, and then down-convert the digital signal to a baseband frequency region, and then perform equalization on the down-converted digital signal, thereby reducing distortions caused by introduction of spurious signals by the ADC.

7 Claims, 7 Drawing Sheets

DIGITAL DOWN CONVERTER WITH BASEBAND EQUALIZATION

FIELD OF THE TECHNOLOGY

The technology relates to high speed analog-to-digital converters (ADCs) and, more particularly, to digital equalization in frequency down-converters, for example, as might be used in wireless receivers.

BACKGROUND

Down-converters in wireless receivers perform a transformation of a radio frequency (RF) signal into a baseband signal centered at zero frequency. In high performance equipment, digital down-converters are used, making it necessary to convert an analog RF signal into a digital signal. Typically, a high-speed ADC is used because of the high frequency of the RF signal.

High speed analog to digital converters are generally built as composite ADCs that consist of a number of time interleaved sub-ADCs with a common input and sequential timing. In general, the amplitude frequency response and phase frequency response of the different sub-ADCs are not identical, resulting in specific signal distortions, for example, the appearance of spurious frequency components. To prevent these distortions, equalization of the responses of the sub-ADCs is used (see, for example, U.S. Pat. No. 7,408,495).

A block diagram of a conventional digital down-converter with an equalizer, is shown in FIG. 1. An RF signal, applied to the input of a composite ADC 1, is transformed into a digital signal. The misalignment of the frequency responses of the sub-ADCs of ADC 1, is corrected by an equalizer 2. An I/Q demodulator is constructed using two mixers 3 and 5 with a common local oscillator frequency $\omega_{LO}$ and with a phase difference of 90 degrees. Low pass filters 4 and 6 produce two outputs labeled In-Phase (I) and Quadrature (Q).

The equalizer 2 and the low pass filters (LPFs) 4 and 6 in the block diagram of FIG. 1 are built usually as conventional finite impulse response (FIR) filters. The most resource-consuming components of such FIR filter are multipliers. Because of the difference between the RF signal frequency (typically several GHz) and the frequency of operation of present-day FPGAs (up to 200-250 MHz), each multiplication in the FIR filters is carried out by a group of multipliers connected in parallel. The required number of multipliers becomes the main reason that makes it necessary to use in the equalizer design, more FPGAs and/or FPGAs of larger size or, in some cases, makes the real time equalizer design impossible.

This problem was solved (partially at least) in U.S. Pat. No. 9,148,162; U.S. Pat. No. 9,634,679; and U.S. Pat. No. 9,641,191. In those patents, it was proposed there to combine equalization with down conversion, performing equalization in I and Q branches of the down converter separately. Furthermore, the cascade connected units in each branch (equalizer, low pass filter and, maybe, mixer) are replaced by a single finite impulse response (FIR) filter. A decimator is placed inside the FIR before the multipliers. In that way the frequency of each multiplication in the down converter is lowered and the number of required multipliers is reduced significantly.

That solution, which is proposed in the above-cited patents, makes it possible for the first time to design a digital down converter which operates in a real time mode. However, the full potential for reduction in the number of multipliers is not completely exploited. The equalizers in the above-cited patents are required to correct the frequency responses from zero frequency up to the Nyquist frequency, whereas the bandwidth of the processed signals is much narrower. When the bandwidth of the equalizer operation is made narrower in these prior art approaches, the number of taps in the equalizers is cut down proportionally, with the required number of multipliers being reduced as much. The bandwidth of the equalizer operation may be reduced by placing it after the low pass filters, but since samples at the filter outputs are formed as linear combinations of samples produced by all sub-ADCs, the correction of misalignment of frequency responses in this situation becomes impossible.

A number of approaches for correcting misalignment of frequency responses in digital down-converters have been proposed for simplified composite ADCs consisting of two sub-ADCs. For example, U.S. Pat. No. 9,628,097 by Johannson "Methods and devices for handling channel mismatches of an I/Q down-converted signal and a two-channel TI_ADC" describes procedure for compensating ADC mismatch based on I/Q down-converted signals. However, this procedure requires the generation intermediate "service" signals with over-sampling, and does not address overall equalization required for digital down-conversion. A journal paper by Singh, Epp et. al, "Analysis, Blind Identification, and Correction of Frequency Response Mismatch in Two-Channel Time-Interleaved ADCs' (IEEE Transactions On Microwave Theory and Techniques, Vol. 63, No. 5, May 2015), describes theoretical spectra distortions for an ADC with time-interleaved sub-ADCs, and proposed to use blind mismatch identification of two ADC responses and adaptive filtering for frequency response correction. The method of adaptive equalization is not applicable to real time down-conversion applications since adaptive equalization may have significant time lag and convergence issues, and may require transmission of special pilot signals. Moreover, the adaptive equalization method depends on a transmitted signal and is not applicable for test and measurement applications. A calibrated reference high speed ADC with down-conversion is a requirement for characterization of RF equipment, such as analog up- and down-converters, filters and transmission/receiver antennas.

An object of the present technology is provide a digital down-converter, where the bandwidth of equalizer operation is equal to the bandwidth of the processed signals, while at the same time to correcting misalignment of the frequency responses of the sub-ADCs of a composite ADC.

DETAILED DESCRIPTION

Figure 1:
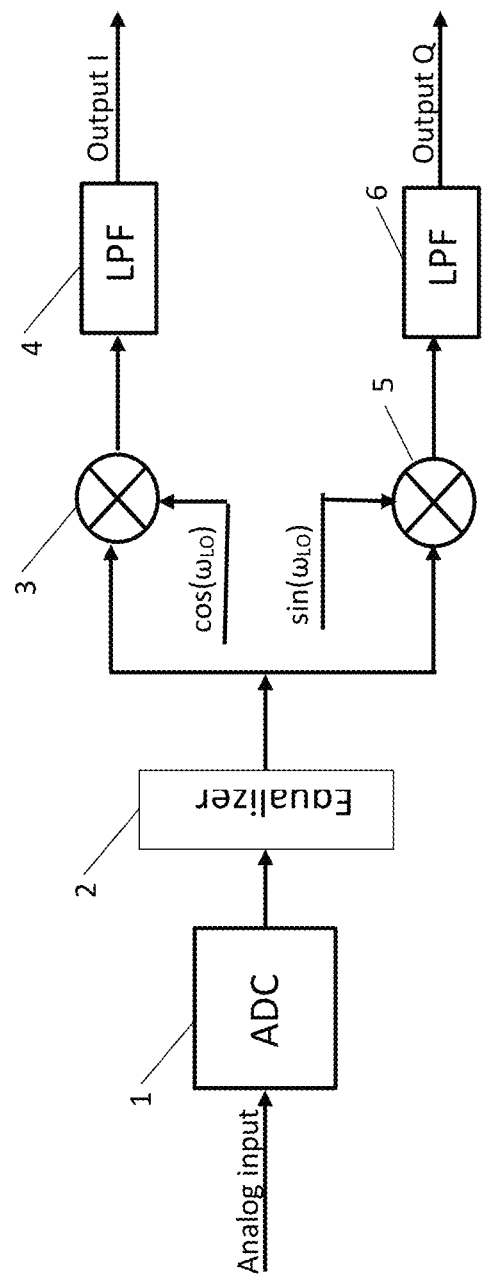
FIG. 1 depicts, in block diagram form, an exemplary prior art down-converter with equalization.
Figure 2:
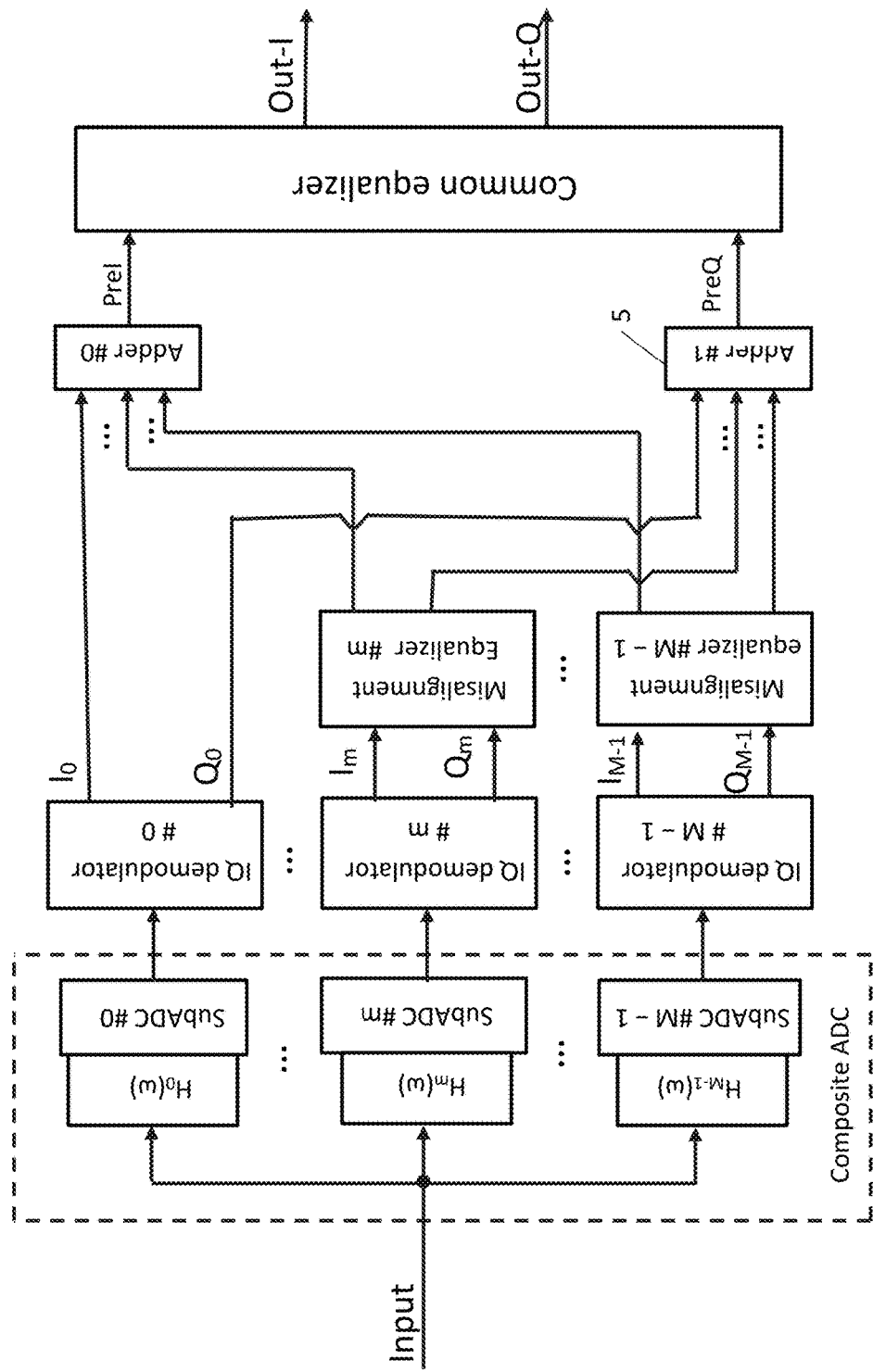
FIG. 2 depicts, in block diagram form, an exemplary digital down-converter with equalization according to the present technology.

A block diagram of a first embodiment of a digital down converter with equalization according to the present technology, is shown in FIG. 2. In this diagram, a composite ADC with a sampling frequency $f_s$, consisting of M time interleaved sub-ADCs, transforms the input analog signal into M partial digital signals, each partial digital signal having a sampling frequency $f_s/M$.

The front-end circuits of the sub-ADC with the number m, where $0 \leq m \leq M-1$, have a frequency response $H_m(f)$, alternatively referred to as $H_m(\omega)$ in FIG. 2. Due to the imperfections of the front-end circuits, the frequency responses $H_m(f)$ are distorted, and are different for different m. If the input analog signal has a spectrum $F[f]$, then the signal, that comes to the sample-and-hold unit in a sub-ADC, has a spectrum $F[f] \cdot H_m(f)$.

Since a sub-ADC operates with under-sampling, the signal at its output contains frequency components reflected from the frequencies $k \cdot f_s/M$, $1 \leq k \leq M-1$. As a result, the partial digital signal, or output signal, produced by the $m^{th}$ sub-ADC, has a spectrum:

$$S_{pds,m}(f) = 1/M \sum_{k=0}^{M-1} \exp(-j2\pi \cdot m \cdot k/M) \cdot H_m(f - k \cdot f_s/M) \cdot F(f - k \cdot f_s/M)$$

(see, for example, J. G. Proakis and D. G. Manolakis, "Digital signal processing", 1996, pp 785-787).

One of basic operations performed in a down converter, is a frequency transformation, which transfers a processed signal into a baseband frequency region. In the digital down converter with equalization according to the present technology, the frequency transformation is carried out in parallel, for each partial digital signal separately. That schematic solution makes it possible to correct the distortions caused by the differences between frequency responses of the different sub-ADCs in the baseband frequency region after the frequency transformation.

Figure 3:
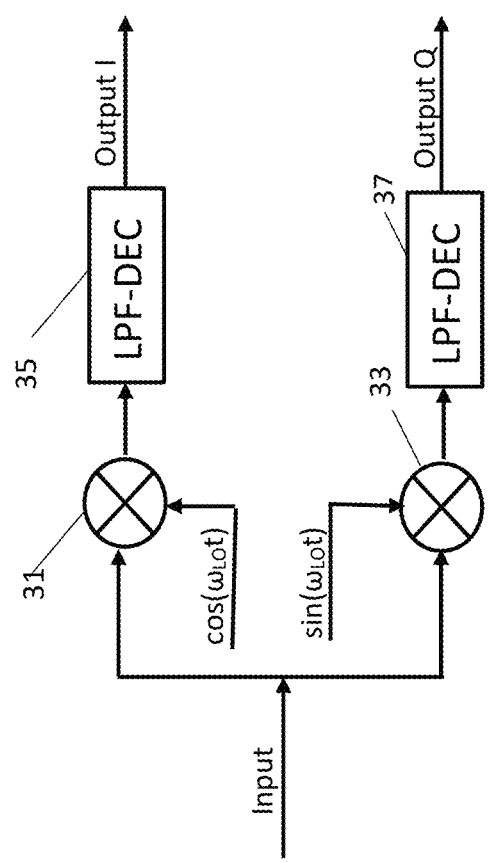
FIG. 3 depicts, in block diagram form, an exemplary IQ demodulator included in the down-convertor of FIG. 2.

In the configuration of FIG. 2, the frequency transformation for the output signals of the respective sub-ADCs, is performed by a set of M IQ demodulators. The IQ demodulators are well-known devices, which transform input RF signals into output complex baseband signals, using a local oscillator with the frequency $f_{lo}$. The real parts of the output complex baseband signals are placed at the In-phase outputs of the IQ demodulators (outputs $I_m$ in FIG. 2). The imaginary parts of the output complex baseband signals are placed at the quadrature outputs of the IQ demodulators (outputs $Q_m$ in FIG. 2). A detailed block diagram of an exemplary IQ demodulator is shown in FIG. 3. Each IQ demodulator includes two mixers 31 and 33, each having a first input and a second input, and an output coupled to an associated input of one of two combined low pass filters/decimators (LPF-DECs) 35 and 37. In each IQ demodulator, an input signal (from an associated one of the sub-ADCs) is applied to the first input of each of the two mixers 31 and 33. A common local oscillator at frequency $\omega_{LO}$ provides two sinusoid signals, having a phase difference of 90 degrees; a first sinusoid signal $\cos(\omega_{LO}t)$ is applied to the second input of mixer 31, and a second sinusoid signal $\sin(\omega_{LO}t)$ is applied to the second input of mixer 33. The output of LPF-DEC 35 is an In-Phase baseband partial digital signal, Output I, and the output of LPF-DEC 37 is a Quadrature baseband partial digital signal, Output Q.

The spectrum $S_{BB,m}(f)$ of the baseband partial digital signal produced by an IQ demodulator with the number m, equals:

$$S_{BB,m}(f) = S_{pds,m}(f + f_{lo}) = 1 \sum_{k=0}^{M-1} \exp(-j2\pi \cdot m \cdot k/M) \cdot H_m(f + f_{lo} - k \cdot f_s/M) \cdot F(f + f_{lo} - k \cdot f_s/M),$$

where $f_{lo}$ is the frequency of the local oscillator used in the frequency transformation.

The spectrum $S_{BB,m}(f)$ consists of the principal part $H_m(f+f_{lo}) \cdot F(f+f_{lo})$, corresponding to k=0, and a set of reflections $H_m(f+f_{lo}-k \cdot f_s/M) \cdot F(f+f_{lo}-k \cdot f_s/M)$ from the frequencies $k \cdot f_s/M$, $1 \leq k \leq M-1$. The total reflection from the frequency $k \cdot f_s/M$ is obtained by summing up over all baseband partial digital signals. The spectrum $S_{refl,k}(f)$ of the total reflection with the number k equals $$S_{refl,k}(f) = F(f + f_{lo} - k \cdot f_s/M) \Big/ \sum_{k=0}^{M-1} \exp(-j2\pi \cdot m \cdot k/M) \cdot H_m(f + f_{lo} - k \cdot f_s/M).$$

In an ideal composite ADC, the sub-ADCs would be identical, so that all frequency responses $H_m(f+f_{lo}-k \cdot f_s/M)$ would be the same. In such a situation, all addends in the sum of the last equation cancel each other, so that this sum equals zero. This means that the total reflection from the frequency $k \cdot f_s/M$ equals zero as well. However, in real composite ADCs, the frequency responses $H_m(f+f_{lo}-k \cdot f_s/M)$ are different, and the combined reflections are distinct from zero, resulting in the appearance of spurious frequency components in the output signal of a digital down converter.

According to the present technology, the spurious components are eliminated by passing each baseband partial digital signal (except the baseband partial digital signal, produced by IQ demodulator with the number m=0) through a misalignment equalizer with a frequency response $K_{ME,m}(f)$, $1 \leq m \leq M-1$. The expression for the spectrum $S_{eq,k}(f)$ of the total reflection with the number k after the equalization becomes:

$$S_{eq,k}(f) = F(f + f_{lo} - k \cdot f_s/M)/M \cdot \Bigg( H_0(f + f_{lo} - k \cdot f_s/M) + + \sum_{m=1}^{M-1} \exp(-j2\pi \cdot m \cdot k/M) \cdot H_m(f + f_{lo} - k \cdot f_s/M) \cdot K_{ME,m}(f) \Bigg).$$

The frequency responses $K_{ME,m}(f)$, $1 \le m \le M-1$, are calculated in such a way as to make the spectrums $S_{eq,k}(f)$ equal to zero for each k, $1 \le k \le M-1$. This requirement is equivalent to a set of M−1 equalities:

$$H_0(f + f_{lo} - k \cdot f_s/M) + \sum_{m=1}^{M-1} \exp(-j2\pi \cdot m \cdot k/M) \cdot H_m(f + f_{lo} - k \cdot f_s/M) \cdot K_{ME,m}(f) = 0.$$

All together these equalities form a system of M−1 linear equations with the unknowns $K_{ME,m}(f)$. Solution of this system for each frequency f in the down conversion band of interest allows a determination of the desired frequency responses $K_{ME,m}(f)$ of the M−1 misalignment equalizers.

There are two adders in the block diagram of the FIG. 2: the adder #0 and the adder #1. The inputs of the adder #0 are connected to the in-phase output of the IQ demodulator #0 and to the in-phase outputs of the misalignment equalizers. The inputs of the adder #1 are connected to the quadrature output of the IQ demodulator #0 and to the quadrature outputs of the misalignment equalizers.

The outputs of the two adders form a combined complex signal PreI+j·PreQ with a spectrum $S_{ccs}(f)$. Since the use of the misalignment equalizers suppresses all the reflections, the spectrum $S_{cs}(f)$ equals:

$$S_{ccs}(f) = F(f + f_{lo}) \cdot \left( H_0(f + f_{lo}) + \sum_{m=1}^{M-1} H_m(f + f_{lo}) \cdot K_{ME,m}(f) \right).$$

The combined complex signal is processed by a common equalizer. The purpose of this equalizer is to correct the frequency distortions common to all sub-ADCs and to compensate changes of the frequency responses, introduced by the misalignment equalizers. The frequency response of the common equalizer $K_{common}(f)$ is made equal to:

$$K_{common}(f) = 1 \bigg/ \left( H_0(f + f_{lo}) + \sum_{m=1}^{M-1} H_m(f + f_{lo}) \cdot K_{ME,m}(f) \right).$$

The outputs of the common equalizer are used as the outputs of the digital down converter with the equalization. The spectrum $S_{out}(f)$ of the output complex signal OutI+j·OutQ equals $$S_{out}(f) = S_{ccs}(f) \cdot K_{common}(f) = F(f+f_{lo}),$$

as it should be in a down converter, where all the distortions have been corrected.

A modification of the embodiment of the present technology described above, is possible. The system of M−1 linear equations, which is used to find the frequency responses $K_{ME,m}(f)$ of the misalignment equalizers, may be extended with an additional equation:

$$H_0(f + f_{lo}) + \sum_{m=1}^{M-1} H_m(f + f_{lo}) \cdot K_{ME,m}(f) = 1.$$

When such extended system of M linear equations is satisfied, the spectrum of the combined complex signal at the adders outputs equals $S_{ccs}(f) = F(f+f_{lo})$, and the common equalizer becomes unnecessary. The extended system of M linear equations contains as before M−1 unknowns. Such a system may be solved only approximately, for example by a method of the least squares.

The digital down converter may also be built in such a way that each the baseband partial digital signal produced by an associated IQ demodulator, is processed by a misalignment equalizer. In such a situation the block diagram of the FIG. 2 contains M misalignment equalizers and the extended system of M linear equations may be solved exactly. In the general case, the complex signal spectrum at the output of M misalignment equalizers, may be written as:

$$\sum_{m=0}^{M-1} H_m(f + f_{lo}) \cdot K_{ME,m}(f) = D(f)$$

where D(f) is a desirable frequency response at the input of common equalizer. For example, D(f) may be chosen to be equal to an average frequency response of all sub-ADCs. If D(f)=1, then common equalizer is not required.

When the functions of the common equalizer are transferred to the misalignment equalizers, the number of multipliers in the misalignment equalizers increases. The final choice of the structure of the digital down-converter in each specific case, cis best performed after a comparison of required computing recourses.

Figure 4:
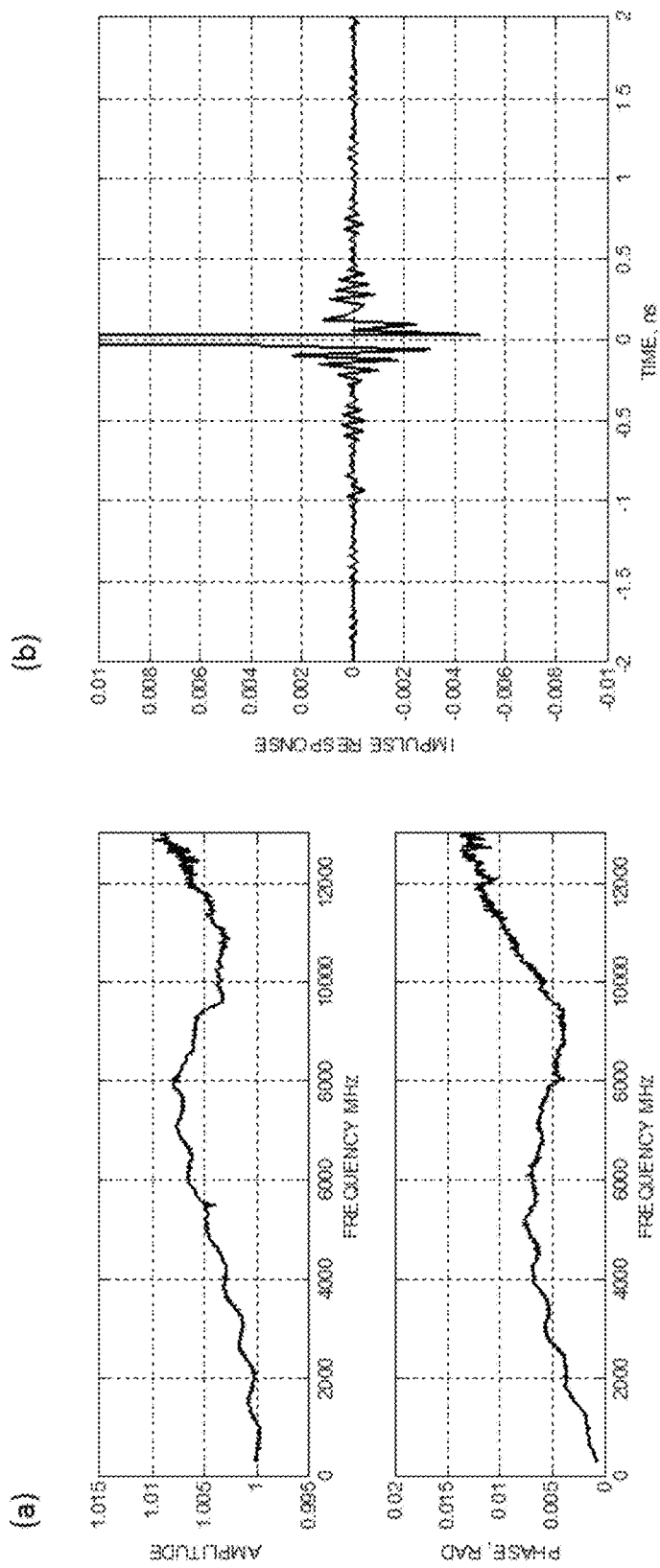
FIG. 4 depicts typical (a) inter-slice amplitude- and phase-frequency responses, and (b) impulse response, of a 32 GS/s composite ADC.

Usually frequency responses of individual sub-ADCs have moderate deviations without abrupt frequency variations. For example, in FIG. 4, part (a) shows amplitude and phase deviations between two 16 GS/s ADC sub-ADCs. As seen, the amplitude and phase variations are small and exhibit wavy low-frequency dependence. In FIG. 4, part (b) shows reconstructed impulse response (magnified) corresponding to slice deviation. This response is concentrated within 2 ns from the main peak. A composite ADC with a 32 GS/s sampling rate, requires a conventional equalizer (FIR) with 64 taps to correct features of the responses of the sub-ADCs. In a digital down-converter according the present technology, since a misalignment equalizer is applied after decimation, the required FIR length is reduced to 64/M taps, where M is the decimation factor. In this example, only a 7 taps misalignment equalizer is sufficient for M=10.

Figure 5:
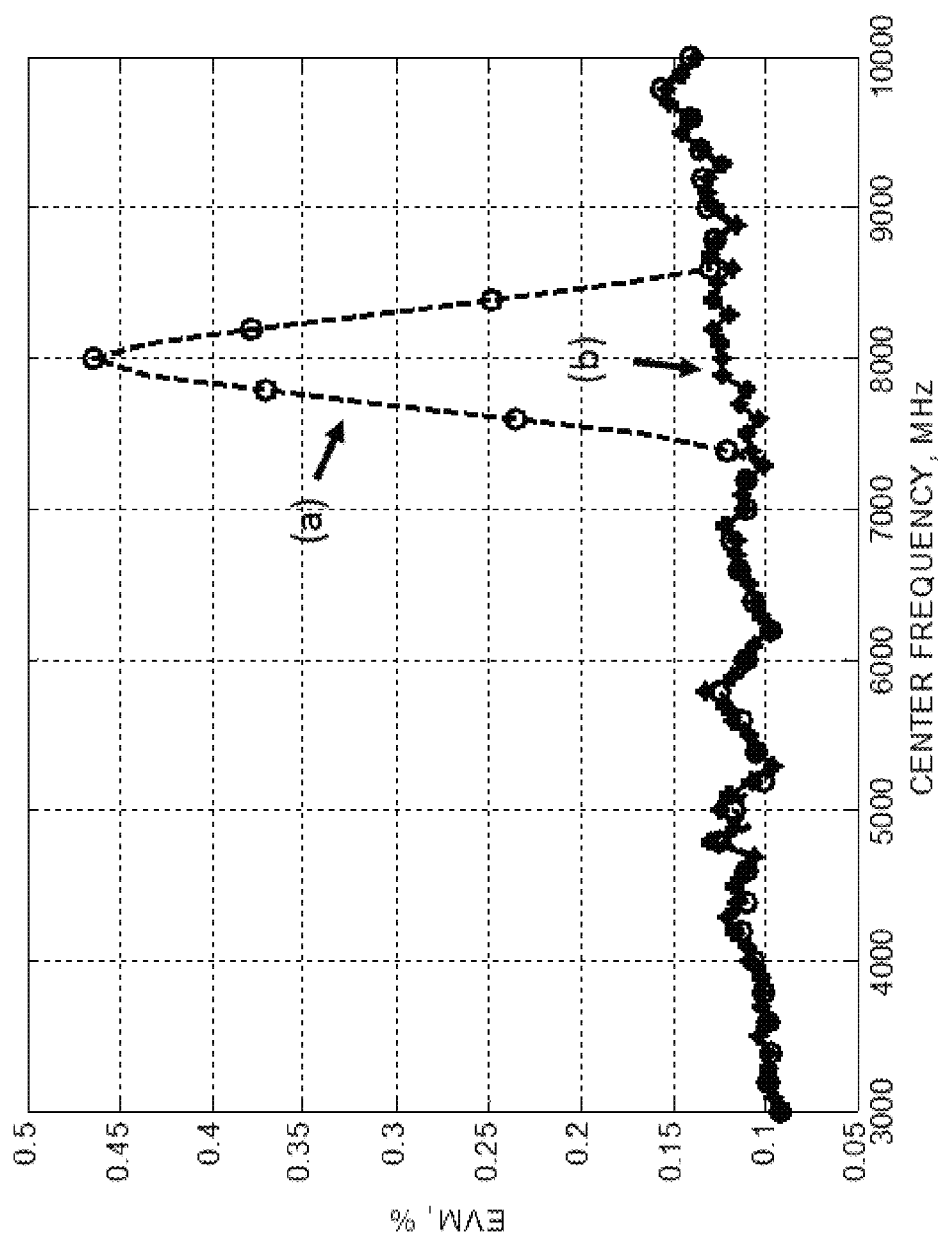
FIG. 5 depicts a QAM64 EVM simulation for a 32 GS/s composite ADC with 2 sub-ADCs (a) without misalignment correction, and (b) with 7-taps misalignment correction.

FIG. 5 shows results of an EVM calculation for a QAM64 signal with a 32 GS/s composite ADC having 2 sub-ADCs, one 7 taps misalignment equalizer and a 115 taps common equalizer. The QAM64 signal with a 2 GHz bandwidth was down-converted with a decimation factor DF=10. A main spur region can be seen around 8 GHz (curve (a) in FIG. 5, calculated without slice correction). However, that spur signal is fully eliminated using the 7 taps misalignment equalizer and the 115 taps common equalizer, with the resulting EVM close to 0.12% (curve (b) in FIG. 5).

Figure 6:
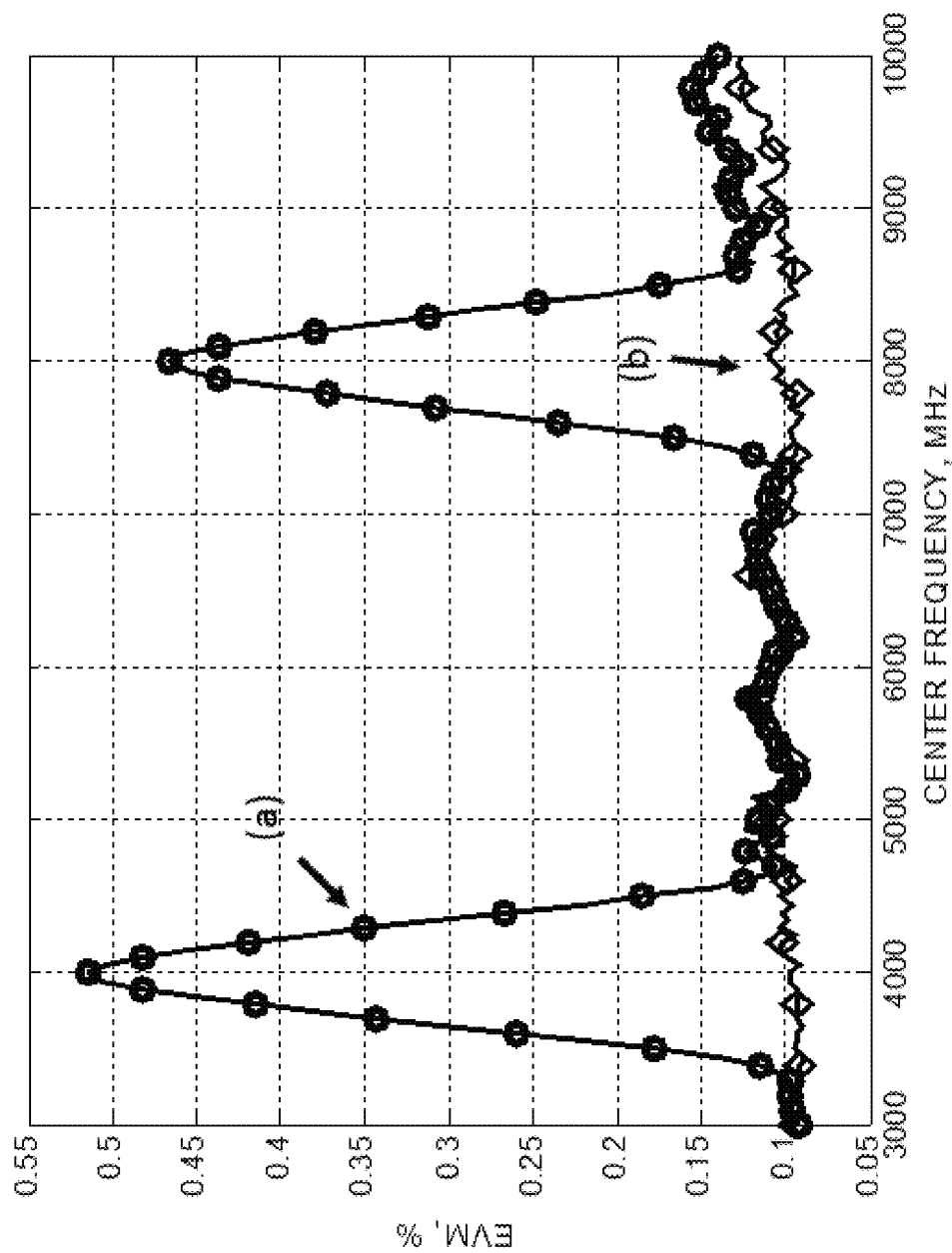
FIG. 6 depicts a QAM64 EVM simulation for a 32 GS/s composite ADC with 4 sub-ADCs (a) without misalignment equalization, and (b) with three misalignment equalizers using 7 taps.

A composite 32 GS/s ADC having 4 sub-ADCs, generates spurs at 4 GHz and 8 GHz, corresponding to reflections from 16 and 8 GHz (curve (a) in FIG. 6). An EVM calculation for a down-converter with equalization, which uses 3 misalignment equalizers with 7 taps and a 115 taps common equalizer, shows suppression of both spurs with low a residual EVM level (curve (b) in FIG. 6).

Figure 7:
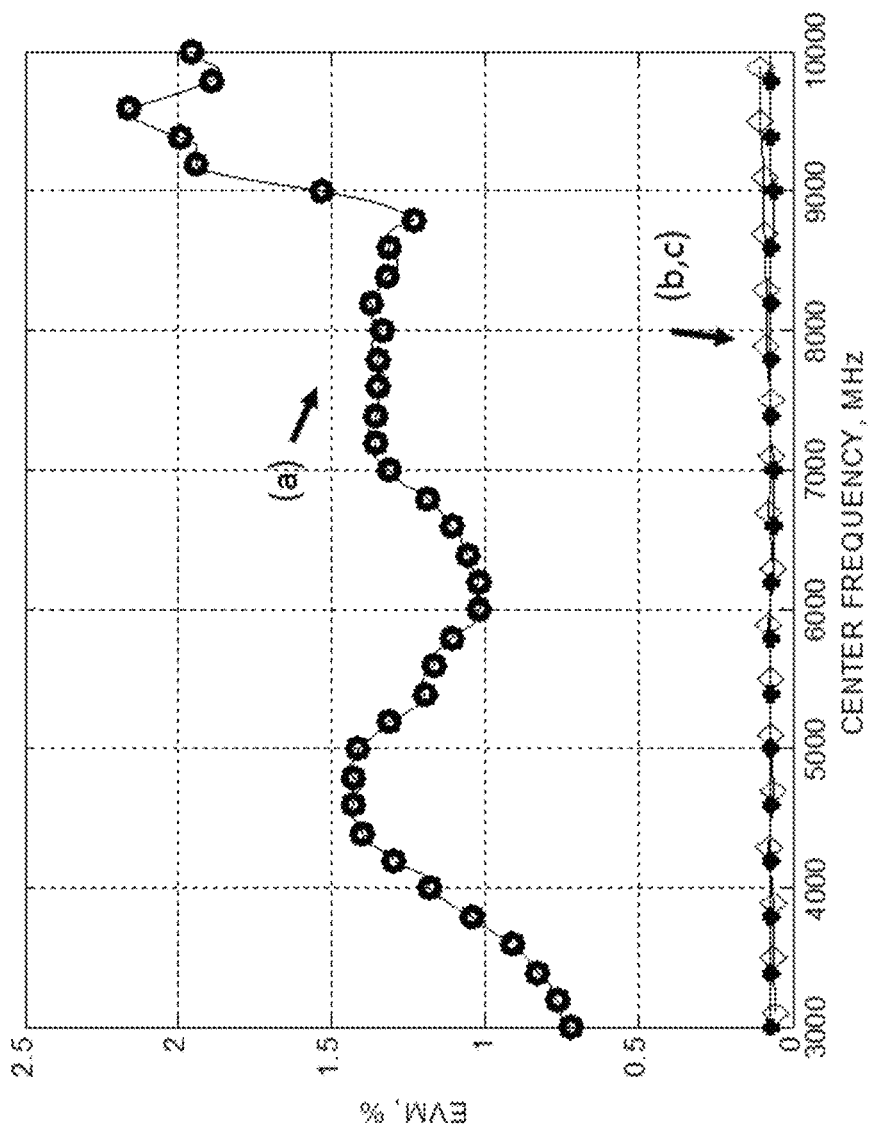
FIG. 7 depicts a comparison of EVM level using a conventional 159 taps full-bandwidth equalizer (curve a), a conventional 1150 taps full-bandwidth equalizer (curve b) and a down-converter with baseband equalization of the present technology comprising a 115 taps common equalizer following 7 taps misalignment equalizers (curve c).

In FIG. 7, curve (a) illustrates achievable EVM levels in a conventional down-converter that uses a 159 taps full-bandwidth equalizer, resulting in 1 to 2% of EVM. A conventional full bandwidth digital down-converter equalizer, correcting all frequency response distortions to a 0.1% EVM level, requires a 1150 taps (EVM levels for that conventional configuration are shown in FIG. 7, curve (b)). Such a very long FIR filter in that configuration cannot be implemented in real time due to the limited number of multipliers that is practical. However, with a digital down-converter implementing the technology, a same residual EVM level is achieved using 7 taps misalignment equalizers followed by a 115 taps common equalizer (the EVM levels for the digital down-converter implementing the technology are shown in FIG. 7, curve (c), where curve (c) is essentially the same as curve (b)).

Although the foregoing description of the embodiment of the present technology contains some details for purposes of clarity of understanding, the technology is not limited to the detail provided. There are many alternative ways of implementing the technology. The disclosed embodiment is illustrative and not restrictive.

What is claimed is:

1. A digital down-converter system, comprising:
   A. a composite analog-to-digital converter (ADC),
      including M sub-ADCs characterized by time-interleaved sampling signals at frequency $f_s$, where M is an integer, and
      wherein the M sub-ADCs have a common input for receiving an applied RF analog signal, and have M outputs, wherein each output is associated with a different one of the M sub-ADCs,
      wherein the composite ADC is adapted to convert the applied analog signal into a set of M partial digital signals, each partial digital signal having a frequency $f_s/M$, and being synchronous with an associated one of the time-interleaved sampling signals and
      wherein the M partial digital signals are each applied to an associated one of the M sub-ADC outputs; and
      whereby the composite ADC is adapted to convert the applied RF analog signals to the M partial digital signals, and
   B. a down-converter adapted to separately down-convert the M partial digital signals to a baseband frequency region, and then perform equalization separately on each of M−1 of the down-converted partial digital signals, thereby reducing distortions caused by introduction of spurious signals by the respective sub-ADCs of the composite ADC.

2. The digital down converter system according to claim 1, wherein the down-converter comprises:
   a. a set of M IQ demodulators, each IQ demodulator having an input connected to an associated output of the composite ADC, an in-phase output and a quadrature output,
      wherein each of the IQ demodulator transforms its applied one of the M partial digital signals into an output complex baseband signal, wherein the output complex baseband signal has a real part and an imaginary part,
      wherein, for each of the IQ demodulators, the real part of the complex baseband signal is applied to the In-phase output I of the IQ demodulator and the imaginary part of the complex baseband signal is applied to the quadrature output Q of the IQ demodulator;
   b. a set of N misalignment equalizers, where N≥M−1, wherein each misalignment equalizer has an in-phase input connected to the in-phase output of an associated one of the M IQ demodulators, a quadrature input connected to the quadrature output an associated one of the M IQ demodulators, an in-phase output and a quadrature output,
      wherein each misalignment equalizer is adapted to produce a complex signal, wherein a real part of the produced complex signal is applied to the in-phase output $I_R$ of the misalignment equalizer and the imaginary part of the produced complex signal is applied to the quadrature output $Q_R$ of the misalignment equalizer;
   c. a first adder having M first adder inputs and a first adder output, wherein the in-phase output I of a first of the IQ demodulators is connected to a first of the M first adder inputs, and the in-phase outputs $I_R$ of the N misalignment equalizers are connected to an associated one of the remaining first adder inputs, wherein the first adder is operative to provide a sum of the first adder inputs PreI at the first adder output;
   d. a second adder having M second adder inputs and a second adder output, wherein the quadrature output Q of the first of the IQ demodulators is connected to a first of the M second adder inputs, and the quadrature outputs $Q_R$ of the N misalignment equalizers are connected to an associated one of the remaining second adder inputs, wherein the second adder is operative to provide a sum of the second adder inputs PreQ at the second adder output; and
   e. a common equalizer with a frequency response $K_{CE}(f)$, having a common in-phase input connected to the first adder output, a common quadrature input connected to the second adder output, a common in-phase output and a common quadrature output,
      wherein the common equalizer is operative to multiply a spectrum of a complex input signal comprising real part PreI and imaginary part PreQ by the common equalizer frequency response $K_{CE}(f)$ to obtain a complex product, and apply a real part of the product Out-I to the common in-phase output and apply an imaginary part of the product Out-Q to the common quadrature output.

3. The digital down converter system according to claim 2, wherein the sub-ADCs each include a front-end circuit, wherein the front-end circuit of the $m^{th}$ sub-ADC, where 0≤m≤M−1, are characterized by a frequency response $H_m(f)$ and:
   A. the number N of misalignment equalizers equals M−1;
   B. the frequency responses $K_{ME,m}(f)$ of the misalignment equalizers are determined by a solution of a system of M−1 linear equations, whereas the equation with a number k, where 1≤k≤N, has a form $$H_0(f + f_{lo} - k \cdot f_s / M) + \sum_{m=1}^{M-1} \exp(-j2\pi \cdot m \cdot k / M) \cdot H_m(f + f_{lo} - k \cdot f_s / M) \cdot K_{ME,m}(f) = 0; \text{ and}$$

C. the common equalizer has a frequency response $K_{CE}(f)$ $$K_{common}(f) = T(f) \Big/ \left( H_0(f + f_{lo}) + \sum_{m=1}^{M-1} H_m(f + f_{lo}) \cdot K_{ME,m}(f) \right),$$

where T(f) is a target frequency response of the down-converter.

4. The digital down converter system according to claim 2, wherein
  A. the number N of misalignment equalizers equals M;
  B. the set of frequency responses $K_{ME,m}(f)$ of the misalignment equalizers is determined by a solution of a system of M linear equations, wherein the equations have a form $$\sum_{m=0}^{M-1} K_{ME,m}(f) \cdot H_m(f + f_{LO} - k \cdot f_s/M) = 0, \quad \text{if } k > 0, \text{ and}$$

$$\sum_{m=0}^{M-1} K_{ME,m}(f) \cdot H_m(f + f_{LO}) = D(f + f_{LO}), \quad \text{if } k = 0,$$

where D(f) is a target frequency response at the output of the misalignment equalizers; and
  C. the common equalizer has a frequency response $K_{CE}(f)$ equal to $$K_{common}(f) = T(f)/D(f+f_{LO}),$$

where T(f) is a target frequency response of the down converter.

5. The digital down converter system according to claim 2, wherein the common equalizer has a frequency response $K_{CE}(f)=1$ while a set of frequency responses $K_{ME,m}(f)$ of the misalignment equalizers is found as a solution of a system of M linear equations, wherein the equations have a form $$\sum_{m=0}^{M-1} K_{ME,m}(f) \cdot H_m(f + f_{LO} - k \cdot f_s/M) = 0, \quad \text{if } k > 0, \text{ and}$$

$$\sum_{m=0.}^{M-1} K_{ME,m}(f) \cdot H_m(f + f_{LO}) = T(f + f_{LO}), \quad \text{if } k = 0.$$

6. The digital down converter system according to claim 5, wherein the number N of the misalignment equalizers equals the number M of the sub-ADCs in the composite ADC.

7. The digital down converter system according to claim 5, wherein the number N of the misalignment equalizers equals M−1, and the set of frequency responses $K_{ME,m}(f)$ of the misalignment equalizers is found as an approximate solution of the system of M linear equations.

* * * * *